United States Patent [19]

Gibson et al.

[11] Patent Number: 5,424,656

[45] Date of Patent: Jun. 13, 1995

[54] CONTINUOUS SUPERCONDUCTOR TO SEMICONDUCTOR CONVERTER CIRCUIT

[75] Inventors: David A. Gibson, Austin, Tex.; Uttam S. Ghoshal, Berkeley, Calif.

[73] Assignee: Microelectronics And Computer Technology Corporation, Austin, Tex.

[21] Appl. No.: 59,476

[22] Filed: May 7, 1993

[51] Int. Cl.6 .......................................... H03K 19/195
[52] U.S. Cl. ........................................... 326/63; 326/3; 327/367
[58] Field of Search ................ 307/541, 245, 306, 475, 307/476

[56] References Cited

U.S. PATENT DOCUMENTS

| | | | |
|---|---|---|---|
| 4,633,439 | 12/1986 | Harada et al. | 365/162 |
| 4,780,750 | 10/1988 | Nolan et al. | 357/23.5 |
| 4,785,426 | 11/1988 | Harada | 365/162 |
| 4,845,539 | 7/1989 | Inoue | 357/23.6 |
| 4,888,629 | 12/1989 | Harada et al. | 357/5 |
| 4,891,682 | 1/1990 | Yusa et al. | 357/30 |
| 4,980,580 | 12/1990 | Ghoshal | 307/476 |
| 5,024,993 | 6/1991 | Kroger et al. | 505/1 |
| 5,231,313 | 7/1993 | Itoh | 307/480 |
| 5,253,199 | 10/1993 | Gibson | 365/162 |

FOREIGN PATENT DOCUMENTS

| | | | |
|---|---|---|---|
| 0344925 | 12/1989 | European Pat. Off. | 307/476 |
| 63-1085 | 6/1986 | Japan . | |
| 3139919 | 6/1991 | Japan | 307/476 |

OTHER PUBLICATIONS

Chen, John Y.; CMOS Devices and Technology For VLSI; © 1990 by Prentice-Hall, Inc.; pp. 101–102.
W. Carr et al., MOS/LSI Design And Application, p. 74, McGraw-Hill, 1972.
M. Aoki et al., "Performance and Hot-Carrier Effects of Small CYRO-CMOS Devices", *IEEE Transactions on Electrons Devices*, vol. 34, pp. 8–18, Jan. 1987.
J. Sun et al., "Submicronmeter-Channel CMOS for Low-Temperature Operation", *IEEE Transactions on Electron Devices*, vol. 34, pp. 19–27, Jan. 1987.
S. Broadbent, "Operation of CMOS Devices at 10 Kelvin", *Proceedings of the Symposium on Low Temperature Electronics*, vol. 88–9, The Elctrochemical Society, pp. 170–176, Oct. 1987.
O. Kindl et al., "CRYO CMOS Technology", *Proceedings of the Symposium on Low Temperature Electronics*, vol. 88–9, The Electrochemical Society, pp. 518–523, Oct. 1987.
H. Suzuki et al., "A Josephson Driver to Interface Josephson Juntions to Semiconductor Transistors", *1988 IEEE Int. Electron Dev. Meeting Technical Digest*, pp. 290–293.
E. Simoen et al., "Freeze-out Effects on NMOS Transisotr Characcteristics at 4.2K", *IEEE Transactions on Electron Devices*, vol. 36, pp. 155–1161, Jun. 1989.
W. Henkles et al., "A 12-ns Low-Temperature DRAM", *IEEE Transactions on Electron Devices*, vol. 36, pp. 1414–1422, Aug. 1989.
S. Iyer et al., "Heterojunction Bipolar Transistors Using Si-Ge Alloys", *IEEE Transactions on Electron Devices*, vol. 36, pp. 2043–2064, Oct. 1989.
T. Elewa et al., "Performance and Physical Mechanisms in SIMOX MOS Transistors Operated at Very Low Temperature", *IEEE Transactions on Electron Devices*, vol. 37, pp. 1007–1019, Apr. 1990.
1991 *ISSCC Digest of Technical Papers*, pp. 30–31, Feb. 1991.

(List continued on next page.)

Primary Examiner—Edward P. Westin
Assistant Examiner—Benjamin D. Driscoll
Attorney, Agent, or Firm—David M. Sigmond; Michael J. Ritter; Michael Caywood

[57] ABSTRACT

Apparatus for converting superconductor low level signals to semiconductor signal levels utilizing a continuous superconductor to semiconductor converter circuit biased for maximum gain and without the need for a clocked reset signal. Employing a unique biasing arrangement utilizing two capacitors and one transistor, this circuit has long term bias voltage retention and good power supply noise rejection ratio.

17 Claims, 8 Drawing Sheets

OTHER PUBLICATIONS

L. Deferm et al., "The Importance of the Internal Bulk-Source Potential on the Low Temperature Kink in NMOST's", *IEEE Transactions on Electron Devices*, vol. 38, pp. 1459–1466, Jun. 1991.

J. Wang et al., "Threshold Voltage Instability at Low Termperatures in Partially Depleted Thin-Film SOI MOSFET's", *IEEE Electron Device Letters*, vol. 12, pp. 300–302, Jun. 1991.

D. H. Seib, "Cryogenic Electronics For Infrared Focal Plane Arrays", *Proceedings of the Sumposium on Low Temperature Electronics*, vol. 88–9, The Electrochemical Society, pp. 499–517, Oct. 1987.

Extended Abstracts of the Symposium on Low Temperature Device Operation, vol. 91–1, *The Electrochemical Society*, pp. 382–430, May 1991.

T. Chappell, S. Schuster, B. Chappell, J. Allan, J. Sun, S. Klepner, R. Franch, P. Greier and P. Restle, "A 3.5 ns/77 K and 6.2-ns/300 K 64K CMOS RAM with ECL Interfaces," *IEEE Solid-State Circuits*, vol. 24, pp. 859–867, Aug. 1989.

T. D. Clark, R. J. Prance, and A. D. C. Grassie, "Feasibililty of hybrid Josephson field effect transistors," *J. Appl. Phys.*, vol. 51, pp. 2736–2745, 1980.

U. Ghoshal, "CMOS Inter-Chip Interconnection Circuit Using High-Tc Superconducting Tunnel Junctions and Interconnections," *IEEE Electron Device Letters*, vol. 10, pp. 373–376, Aug. 1989.

U. Ghoshal, T. Van Duzer and H. Kroger, "SPICE Models and Applications of Superconducting FETs and Higher-Voltage Josephson Gates," *IEDM Technical Digest*, pp. 349–352 (1991).

U. Ghoshal, H. Kroger and T. Van Duzer, "Superconductive Interconnection Circuits for Cryogenic Semiconductor Systems," *Proceedings of the Symposium on Low Temperature Device Operation*, vol. 91–1, *Electrochemical Society*, 1991, pp. 427–428.

U. Ghoshal, T. Van Duzer, D. Gibson and H. Kroger, "Josephson-CMOS Interface Circuits," IEEE 1992 Custom Integrated Circuits Conference, pp. 23.2.1–23.2.4, May 6, 1992.

A. W. Kleinsasser and T. N. Jackson, "Prospects for Proximity Effect Superconducting FETs," *IEEE Transactions on Magnets*, vol. 25, No. 2, pp. 1274–1277 (1989).

A. W. Kleinsasser and T. N. Jackson, *Superconductivity and field effect transistors*, in Proc. 18th Int. Conf. on Low Termperature Physics (Kyoto); Jpn. J. Appl. Phys., vol. 26, pp. 1545–1546, 1987.

H. Kroger and U. Ghoshal, *Can Superconductive Digital Systems Compete with Semiconductor Systems?*, IEEE Trans. on Appl. Superconductivity, vol. 3, No. 1, pp. 2307–2314, Mar. 1993.

H. Kroger, et al., *Superconductor-Semiconductor Hybrid Devices, Circuits and Systems*, proceedings of the IEEE, vol. 77, No. 8, Aug. 1989.

H. Kroger, *Josephson Devices Coupled by Semiconductor Links*, IEEE Trans. Electron Devices, vol. ED-27, pp. 2016–2126 (1980).

I. Kurosawa, H. Nakagawa, S. Kosaka, M. Aoyagi, S. Takada, *A 1-kbit Josephson RAM Access Memory Using Variable Threshold Cells*, IEEE J. Solid-State Circuits, vol. 24, pp. 1034–1039, Aug. 1989.

J. Martens, V. Hietala, T. Zipperian, G. Vawter, D. Ginley, C. Tigges and T. Plut, "Fabrication of TlCaBaCuO Step-Edge Josephson Junctions with Hysteretic Behavior," preprint submitted to Applied Physics Letters, Feb. 15, 1992.

T. Nichino and U. Kawabe, *Realization of semiconductor-coupled superconducting transistor*, in Proc. 2nd Int. Symp. Foundations of Quantum Mechanics (Tokyo), pp. 231–240, 1986.

A. H. Silver, A. B. Chase, M. McCall, and M. F. Millea, *Superconductor-semiconductor device research*, in Future Trends in Superconductive Electronics, B. S. Dever, C. M. Falco, J. H. Harris, and S. A. Wolf, Eds. New York, N.Y.: Am. Inst. of Physics, 1978, pp. 368–379.

H. Suzuki, T. Imamura and S. Hasuo, *Josephson Semiconductor Interface Circuit*, Cryogenics, vol. 30, pp. 1005–1008, 1990.

T. van Duzer, *Superconductor-Semiconductor Hybrid Devices, Circuits and Systems*, Cryogenics, vol. 28; pp. 527–531 (1988).

G. F. Virshup, M. Klausmeier-Brown, I. Bozovic and J. Eckstein, "Hysteretic High-Tc Josephson Junctions Using Heterostructure Tri-Layer Films Grown by MBE," preprint from Varian Research Center.

U. Ghoshal, H. Kroger and T. Van Duzer, "Superconductor-Semiconductor Memories," *IEEE Transactions*

(List continued on next page.)

OTHER PUBLICATIONS

*on Applied Superconductivity,* vol. 3, No. 1, Mar. 1993, pp. 2315–2318.

W. Henkels, D. Wen, R. Mohler, R. Franch, T. Bucelot, C. Long, J. Bracchita, W. Cote, G. Bronner and R. Dennard, "A 4–Mb Low–Temperature DRAM," *IEEE Journal of Solid–State Circuits,* vol. 26, No. 11, Nov. 1991, p. 1519–1529.

J. Sun et al., "Submicrometer–Channel CMOS for Low–Temperature Operation," *IEEE Transactions on Electron Devices,* vol. 34, pp. 19–27, Jan. 1987.

Kroger, H., et al., "Applications of Superconductivity to Packaging," *IEEE Circuits and Devices Magazines,* May 1989, pp. 16–21, 41.

S. Nagasawa, et al., "Subnanosecond Josephson High Speed Memory," *Microelectronics Research Laboratories, NEC Corporaton,* pp. 401–406, publication and date unknown.

C. Hilbert, D. Gibson and D. Herrell, "A comparison of lossy and superconducting interconnect for computers," submitted for pubication in the IEEE Trans. Electron Devices; vol. 36, No. 9, Sep. 1989.

Kwon, et al., "Superconductors as Very High–Speed System–Level Interconnects," IEEE Electron Device Letters, vol. EDL–8, No. 12, Dec. 1987, pp. 582–585.

CONTINUOUS SUPERCONDUCTOR TO SEMICONDUCTOR CONVERTER CIRCUIT

The U.S. Government has a paid-up license in this invention and the right in limited circumstances to require the patent owner to license others on reasonable terms as provided for by the terms of contract No. N00014-90-C-0219 awarded by the Defense Advanced Research Projects Agency (DARPA).

BACKGROUND OF THE INVENTION

1. Field of the Invention

The present invention relates to hybrid circuits and devices fabricated from superconductor materials combined with semiconductor devices that can be operated at low temperatures. More particularly, the present invention relates to a low power, continuous superconductor to semiconductor converter circuit biased for maximum gain but requiring neither a reset circuit nor a clock signal. The present invention is used to convert the small signal levels of superconducting circuits to the much larger signal levels of semiconductor field effect transistor ("FET") devices at very low temperatures, i.e. less than about 30 Kelvin units (K). The operation of FET devices at low temperatures has application for long-wavelength infrared focal plane arrays and hybrid superconductor-semiconductor circuits and systems. This invention also has application for silicon-on-insulator ("SOI") FET devices at higher temperatures.

2. Description of the Related Technology

The discovery of superconductors whose critical operating temperatures are above liquid nitrogen temperature prompted increased interest in hybrid superconducting-semiconducting electronic circuit applications. For signal processing and computer applications the integration of superconducting circuits with semiconductor circuits has been proposed, see U.S. Pat. No. 5,024,993 by Kroger and Ghoshal, and H. Suzuki et al., "A Josephson Driver to Interface Josephson Junctions to Semiconductor Transistors", 1988 *IEEE Int. Electron Dev. Meeting Technical Digest*, pp. 290–293. There are, however, several problems in interfacing superconducting circuits with semiconductor circuits which interfere with the desired objectives of high-speed, and low-power conversion of superconductor signals to semiconductor signals and vice versa.

At cryo-temperatures (less than about 30K), increased drain-induced barrier lowering and hysteresis effects arising primarily due to carrier freeze-out in the substrate prohibit CMOS devices from being used in sensitive analog circuits. These effects are also well-known but no effective solution has been offered to date. The non-ideal characteristics of CMOS at lower temperatures are described in the following papers (M. Aoki, S. Hanamura, T. Masuhara and K. Yano, "Performance and Hot Carrier Effects of Small Cryo-CMOS Devices", *IEEE Transactions on Electron Devices*, vol. 34, pp. 8–18, January 1987; E. Simoen, B. Dierickx, L. Warmerdam, J. Vermeiren and C. Claeys, "Freeze-out Effects on NMOS Transistor Characteristics at 4K", *IEEE Transactions on Electron Devices*, vol. 36, pp. 1155–1161, June 1989; L. Deferm, E. Simoen and C. Claeys, "The Importance of the Internal Bulk-Source Potential on the Low Temperature Kink in NMOSTs", *IEEE Transactions on Electron Devices*, vol. 38, pp. 1459–1466, June 1991; T. Elewa, F. Balestra, S. Cristoloveanu, I. Hafez, J-P. Colinge, A-J. Auberton-Herve and J. Davis, "Performance and Physical Mechanisms in SIMOX MOS Transistors Operated at Very Low Temperatures", *IEEE Transactions on Electron Devices*, vol. 37, pp. 1007–1019, April 1990).

Some of the problems associated with carrier freeze-out in the substrate can be reduced by fabricating CMOS devices on thin epitaxial layers grown on degenerately doped substrates (see for example, S. Broadbent, "Operation of CMOS Devices at 10K", *Proceedings of the Symposium on Low Temperature Electronics*, vol. 88-9, The Electrochemical Society, pp. 170–176, October 1987). In some cases, the retrograded wells are used. In addition to doping the substrate, the substrate needs to be biased such that the substrate-to-source junctions of the NMOS transistors are reverse biased. This method is complex and does not completely eliminate the hysteresis at low drain currents, thereby making it unsuitable for sensitive analog operation. When the epitaxial layer is thin ($\sim 10$ $\mu$m), the boron out-diffusion from the degenerately doped substrate increases the acceptor concentration through most of the epitaxial layer. This spoils the threshold voltage of the NMOS transistors and makes the transistors susceptible to latch-up at higher temperatures. Thus the circuits cannot be tested at room temperature. When the epitaxial layers are thick ($\sim 20$ $\mu$m), this method cannot eliminate the hysteresis and is largely ineffective. The method also increases the threshold voltages of the NMOS transistors, although the effect has not been explored in detail in the prior art. This method is also not applicable for short-channel devices, since the heavily doped substrate is relatively far from the channel.

A recommended practice for operation of CMOS devices at low temperatures is to provide a grounded bulk contact ring (or channel contact in the case of SOI devices) around every device and prevent the bulk region near the devices from floating at arbitrary potential. This can reduce time-dependent fluctuations of the threshold voltages and make the devices suitable for some digital applications (O. Kindl, W. Langheinrich, G. Fischer, "Cryo-CMOS Technology", *Proceedings of the Symposium on Low Temperature Electronics*, vol. 88-9, The Electrochemical Society, pp. 518–523, October 1987; J. Wang, N. Kistler, J. Woo and C. Viswanathan, "Threshold Instability at Low Temperatures in Partially Depleted Thin-Film SOI MOSFETs", *IEEE Electron Device Letters*, vol. 12, pp. 300–302, June 1991).

If symmetrical PMOS and NMOS devices with the same threshold voltages are required, a common practice is to use p+ polysilicon gates for PMOS transistors and n+ polysilicon gates for NMOS transistors. This "dual-poly" process was first used by researchers at IBM for their 77 K optimized CMOS devices (J. Y. Sun, Y. Taur, R. Dennard and S. Klepner, "Submicrometer-Channel CMOS for Low Temperature Operation", *IEEE Transactions on Electron Devices*, vol. 34, pp. 19–27, January 1987) and later by researchers at Technical University of Darmstadt (O. Kindl, W. Langheinrich, G. Fischer, "Cryo-CMOS Technology", *Proceedings of the Symposium on Low Temperature Electronics*, vol. 88-9, The Electrochemical Society, pp. 518–523, October 1987) for their 2–4K cryo-CMOS devices.

Superconducting circuit technology utilizes signal voltage levels approximately 500 times smaller than, and incompatible with, the signal voltage levels of semiconductor logic circuit technology. Both of the signal current levels, however, are comparable. These signal current levels are typically 0.1 to 30 milliamperes. The superconductor signal voltage level is typically 2 millivolts and may be up to 150 millivolts when utilizing special output driver circuits. Semiconductor logic signal voltage levels have been for the last ten years, 5 volts for complementary metal oxide semiconductor ("CMOS") and 1 volt for emitter coupled logic ("ECL"); however, improvements in these technologies have resulted in new designs requiring only 3 volts for CMOS and 400 millivolts for ECL.

Converting from semiconductor signal voltage levels to superconducting signal voltage levels is easily done with attenuators. Converting from superconducting signals to semiconductor signals, however, requires high gain voltage amplifiers to increase the millivolt signal levels of the superconductor signals to compatible semiconductor signal levels. High gain voltage amplifiers are difficult to implement using superconductor technology; therefore, semiconductor technology must be utilized to achieve the required voltage gain.

Converting the 2 millivolt superconductor circuit signal to a compatible voltage level of 3 or 5 volts for CMOS requires amplification of over 500 times the input signal level. This magnitude of amplification may be obtained by use of high gain voltage amplifiers. In designing high gain voltage amplifiers, however, there is great difficulty in simultaneously achieving high gain, wide bandwidth, short signal delay, low power, small size, high power supply noise rejection ratio, low noise, and insensitivity to temperature variation.

To minimize signal delay and stray noise pickup, it is desirable to place the circuitry of both the superconductors and semiconductors closely together. Minimizing the superconductor and semiconductor device sizes and spacing therebetween achieves the most desirable results as to speed of operation and signal noise immunity. Superconductor circuits must operate in cryo-temperatures. Cryo-temperatures, however, greatly affect semiconductor device operating parameters such as gain-bandwidth-delay, power dissipation versus drive capability, freedom from oscillation, bias stability, and rejection of noise and other error sources. As an example, a transistor has hysteresis at cryo-temperatures. This hysteresis may be the source of very large signal error.

In a high gain semiconductor amplifier circuit a small amount of transistor hysteresis will be amplified to a large output error. In similar fashion, bias circuit instability may induce noise and other errors. Therefore, high gain amplifiers for both analog and digital signals require precise and stable biasing; for an amplifier gain of 500 the bias stability must be controlled to less than one millivolt.

In digital circuits, most of the noise introduced is from switching noise on the semiconductor device power source. Therefore, amplifiers for digital circuits must have very good power supply noise rejection ratio ("PSRR"). For an amplifier circuit to operate in a cryo-environment, it should dissipate minimal power in the form of heat, where 100 microwatts per amplifier circuit is considered large and 1 microwatt small.

A binary digital signal consists of two states or voltage levels. A logic "1" or high state may be represented by a positive voltage greater than the voltage level of a logic "0" or low state. The low state voltage level may be slightly positive, at ground or even negative. A converter is a combination of an amplifier and any additional devices necessary to maintain output voltage levels with margins for input noise. Noise margins are affected by device fabrication parameters.

An example of a converter circuit to convert superconductor signals to semiconductor signals is illustrated in U.S. Pat. No. 5,024,993 entitled "Superconducting-Semiconducting Circuits, Devices and Systems" by Kroger and Ghoshal. The Kroger and Ghoshal patent teaches that the amplifying FET is switched across its turn-on threshold, the use of highly asymmetric transistor sizes having large transistor areas with non-minimum capacitance nodes, and the requirement of a clock input to its biasing circuit which is used to reset the amplifier after converting each bit of data at high data rates.

There is a need for a superconductor to semiconductor converter circuit having low power dissipation, low capacitance, good power supply noise rejection, bias point stability for maximum gain, and requiring no external reset circuitry. It therefore is an object of the present invention to convert superconductor signal levels to semiconductor signal levels with circuits having low power dissipation, low capacitance for high speed, good power supply noise rejection, optimal biasing for maximum amplifier stage gain and requiring no external logic reset circuits.

Another object of the present invention is to amplify millivolt signal levels to multivolt signal levels.

Yet another object of the present invention is to convert millivolt signals to multivolt signals while operating at cryogenic temperatures.

Another object of the present invention is to amplify small signal levels from MOS memory bit lines to semiconductor signal voltage levels.

Yet a further object of the present invention is to amplify millivolt analog signals.

A further object of the present invention is to substantially eliminate the hysteresis problem in CMOS operating at cryogenic temperatures for both digital and analog applications.

SUMMARY OF THE INVENTION

In contrast to the above mentioned technologies, the present invention provides a solution to the problems of converter sensitivity to power supply variations, sensitivity to hysteresis at cryogenic temperatures, non-minimum capacitance nodes, and the requirement for a clock input for resetting the amplifier. The present invention may use semiconductor devices configured as amplifiers such as, for example, field effect transistors ("FETs") biased above threshold. The bias point is chosen so as to be closer to the maximum transconductance conditions of the semiconductor in order to achieve higher gain and switching speed. Operation in the maximum gain region of the semiconductor permits continuous digital signal conversion at high bit rates without additional clock reset circuitry. In addition, a new biasing circuit is disclosed which does not require a clock and which has superior PSRR.

The present invention achieves stable, non-hysteretic operation of CMOS at very low temperatures ($< \sim 30K$) by intentionally forward biasing the body-to-source diode of the individual NMOS and PMOS transistors. The forward biasing of the body-to-source diode produces very good saturation characteristics, even at low current levels. It lowers the threshold voltage of the NMOS and PMOS transistors by 0.2–0.5 volts, thereby eliminating the need to use the "dual-poly" process. The lower threshold voltages permit lower supply voltages ($<2$ V) to be used and lower-power analog and digital circuits can be built. The superior saturation characteristics lead to better voltage gain of the analog amplifiers and extremely good power supply rejection ratios ("PSRR"). The method exploits the low latch-up susceptibilities at very low temperatures when the parasitic bipolar transistors have very low gain. The method can be selectively applied, and mixed analog and digital circuits, with and without hysteresis effects, can be built on the same chip. It does not involve complex processing and the circuits can be tested at room temperatures. The conventional CMOS devices can thus be used at very low temperatures for sensitive amplification.

In order to appreciate the details of the innovation, it is important to understand the phenomenon of hysteresis. Referring now to FIGS. 6a and 6b, an NMOS transistor of a conventional CMOS process is illustrated in plan view and cross section, respectively. Although the guard ring (bulk-contact) is not a conventional design at room-temperature, it is a preferred low temperature design because it provides a reference potential near the device and can eliminate time-dependent variations in the threshold voltage of the NMOS device (O. Kindl, W. Langheinrich, G. Fischer, "Cryo-CMOS Technology", *Proceedings of the Symposium on Low Temperature Electronics*, vol. 88-9, The Electrochemical Society, pp. 518-523, October 1987; J. Wang, N. Kistler, J. Woo and C. Viswanathan, "Threshold Instability at Low Temperatures in Partially Depleted Thin-Film SOI MOSFETs" *IEEE Electron Device Letters*, vol. 12, pp. 300-302, June 1991). Similar complementary structure is used for a PMOS device inside the n-well.

FIG. 6c illustrates a typical hysteretic drain current-voltage of a NMOS transistor when the guard-ring is tied to the source and operated at low temperatures. The hysteretic phenomenon observed at very low temperatures ($< \sim 30$K) results from the accumulation of holes in the bulk under the gate. These holes are generated by impact ionization near the drain and accumulate in the substrate because the carrier-frozen substrate is semi-insulating and the electron-hole recombination rate in the carrier-frozen substrate is very low at very low temperatures. When the holes accumulate under the gate, the bulk potential below the channel is increased and the effective threshold voltage of the NMOS transistor drops and the NMOS transistor is turned on much harder. This results in larger drain currents and more holes accumulate under the channel. The positive feedback mechanism stabilizes when the bulk-to-source junction is forward-biased and the current through the bulk-to-source junction equals the current due to the impact ionization. In the descending $V_{ds}$ scan, the bulk-to-source junction remains forward-biased as long as there is substantial hole accumulation under the gate. The return-scan characteristics depend on the rate at which holes are removed through the body-to-source diode. The saturation characteristics of the NMOS and PMOS transistors are poor because of the distortion (in time as well as space) of the electric field near the drain. This results in poor (differential) output conductances and renders the transistors useless for analog operation.

A non-hysteretic mode of CMOS operation may be obtained if the bulk-to-source junction remains forward. biased during the operation of the CMOS device at low temperatures. Referring now to FIGS. 7a and 7b, an NMOS transistor having its bulk-to-source junction forward-biased is illustrated in plan view and cross section, respectively. In this mode of operation, the bulk-to-source junction is always kept forward-biased using an external voltage bias $V_b$. The forward-bias sweeps all holes generated by impact ionization to the source and prevents accumulation of holes under the channel. There is no time-dependent threshold voltage drifts and the transistor characteristics are ideal as illustrated in FIG. 7c.

The effective threshold voltage of the transistors decreases (linearly) with the forward-bias applied across the bulk-to-source junction. Hence the threshold voltage can be adjusted to a suitable low-level (0.2-0.4 V) for low-voltage supplies (1.5-2 V). For low-power applications, the current through the bulk-to-source junction can be reduced by (a) reducing the forward-bias, (b) reducing the junction area, (c) using a common guard-ring for a group of transistors, and (d) optimizing the geometry of the guard-rings so that the resistances in the bulk-to-source path are smaller.

The transistor characteristics in this mode of operation are close to ideal which means a lack of hysteresis and very low differential output conductances in the saturation regime. The absence of hysteresis guarantees reliable operation of sensitive analog circuits. The low (differential) output conductances in analog amplifiers also imply larger voltage gains and better power supply rejection ratios ("PSRR").

Unlike the other methods described above, the method of forward-biasing the bulk-to-source junction to eliminate hysteresis may be applied to conventional CMOS circuits without changing the fabrication process and is extendable to submicron-channel length transistors. This novel mode of operation may be utilized at very low temperatures without affecting the performance of the circuits at room temperature and hence circuits can be tested at room temperatures.

The method is local, and hence circuits may be fabricated with and without employing this method. This is particularly relevant in mixed analog and digital CMOS circuits, where the critical analog circuits can be operated in the non-hysteretic mode using this novel technique and digital circuits with relaxed constraints can be operated in the hysteretic mode.

The present invention may use field effect transistors such as, but not limited to, metal oxide semiconductor ("MOS") field effect transistor ("FET") technology for positive-channel ("PMOS") and negative-channel ("NMOS"). The amplifiers may use only NMOS, PMOS or may utilize both NMOS and PMOS connected in a complementary metal oxide ("CMOS") configuration. Junction FET ("JFET") or insulated Gate FET ("IGFET") devices may be utilized in the present invention. Bipolar transistors may be used such as, for example, heterojunction bipolar transistors as more fully described in S. S. Iyer et al., "Heterojunction Bipolar Transistors Using Si-Ge Alloys", *IEEE Transactions on Electron Devices*, vol. 36, pp. 2043-2064, October 1989.

The present invention utilizes semiconductor transistor inverters biased midway between logic "1" (a first voltage level) and logic "0" (a second voltage level). The semiconductor inverters are biased as amplifiers with high gain. The inverters used in the present invention may have, for example, a Beta ratio of substantially unity. The Beta ratio is defined as $Wn*Lp/(Wp*Ln)$ where Wn and Ln, and Wp and Lp are the as-drawn gate geometries of the N-channel MOSFET and P-channel MOSFET, respectively. The Kroger and Ghoshal invention utilizes a large Beta ratio which makes the operation of the converter described therein very asymmetric. The Kroger and Ghoshal converter is effectively triggered by the input! signal to switch in one direction only and it is slow to switch back, thus, requiring a clocked reset circuit.

The present invention may be used as a superconductor to semiconductor converter circuit and an embodiment comprises a first CMOS inverter connected as a common-gate amplifier, a capacitive biasing means, and a pass transistor that admits voltage charge on the capacitive biasing means. The capacitive biasing means is connected to the first CMOS inverter, and the pass transistor is connected to the capacitive biasing means and the output of the first CMOS inverter.

The pass transistor initially is in its conductive state (turned on) and establishes a voltage bias level on the capacitive biasing means, wherein the first CMOS inverter is biased at or near its maximum gain. The pass transistor may be used to re-establish the voltage bias level on the capacitive biasing means whenever necessary.

The capacitive biasing means is comprised of two capacitors connected in series. These series-connected bias capacitors are connected between the power supply voltage and ground. By connecting the bias capacitors in series and between the power supply voltage and ground, the present invention is substantially desensitized to power supply variations which may cause signal offset errors and noise.

The first CMOS inverter (common-gate amplifier) of the present invention operates in a small signal mode, amplifying the superconductor signal of approximately 2–5 millivolts to about 100 millivolts. The preferred embodiment of the present invention utilizes a second CMOS inverter operating in a large signal mode. Using two stages of CMOS inverters improves the gain-bandwidth product of the system over that of a single CMOS inverter amplifier.

The second CMOS inverter input is connected to the output of the first CMOS inverter and amplifies the 100 millivolt signal to the full supply voltage which may be, for example, 1 to 3 volts. The present invention utilizes symmetric amplifiers for both first and second CMOS inverters to minimize converter transistor area and avoid the possible need for a reset circuit. However, an asymmetric first inverter may also be used in the present invention.

Initial calibration of the present invention establishes the output of the first CMOS inverter at a voltage approximately halfway between logic 1 and logic 0 voltage levels. This is accomplished by turning on the pass transistor and then controlling the superconductor circuit to produce a voltage halfway between a superconductor logic 1 and 0. The output of the first CMOS inverter is connected to the capacitive biasing means through the pass transistor. The capacitive biasing means is connected to the gate inputs of the first CMOS inverter and thereby biases the first CMOS inverter for maximum Gain. The pass transistor is turned off and the bias voltage derived above is retained by the capacitive biasing means because at cryo-temperatures transistor junction leakage is minimal. For a superconductor signal swing of only a few millivolts, the output voltage swing of the second CMOS inverter will be to the high and low limits of the power supply voltage of the CMOS inverters. At higher operating temperatures the pass transistor may be turned on periodically to re-establish the bias level on the capacitive biasing means.

A feature of the present invention is a circuit to convert superconductor logic signal voltages to semiconductor logic signal voltages using first and second semiconductor transistor inverter amplifiers biased for maximum voltage Gain wherein the bias voltage is stored in a capacitive biasing means initialized by the first inverter output voltage resulting from a calibration signal from the superconductor circuit.

Another feature of the present invention is a circuit to convert superconductor logic signal voltages to semiconductor logic signal voltages without requiring a reset clock input and having an improved power supply noise rejection ratio.

A further feature of the present invention is a circuit to convert superconductor logic signal voltages to semiconductor logic signal voltages using field effect transistors having beta ratios near unity for minimum transistor size and capacitance, maximum Gain-bandwidth, and very low power dissipation.

Yet another feature of the present invention is amplifying low level sensor signals.

Another feature of the present invention is amplifying low level sensor signals at cryogenic temperatures.

An advantage of the present invention is low power consumption.

Another advantage of the present invention is low DC voltage offset drift.

Still another advantage of the present invention is operation at cryogenic temperatures.

A further advantage of the present invention is maintaining a bias level for maximum amplification.

The circuits of the present invention have particular application to a wide variety of both digital and analog circuits used with infrared detectors and imagers, digital image processing, charge coupled devices, and telecommunications switching in communication satellites. In addition, the present invention may be utilized as an analog amplifier of millivolt signals such as, for example, MOS memory bit line signals, sensors such as thermocouples, RTDs, resistive bridges, strain Gauges, magneto electric Hall effect, opto-electric, piezio electric, and radiation sensors such as alpha particle. The present invention may operate at room temperatures or may be used at cryogenic temperatures associated with superconducting technologies or the cold temperatures found in space exploration.

Other and further objects, features and advantages will be apparent from the following detailed description of the preferred embodiment of the invention, given for the purpose of disclosure and taken in conjunction with the accompanying drawings.

BRIEF DESCRIPTION OF THE DRAWINGS

FIG. 6b is a cross section diagram of the NMOS transistor of FIG. 6a;

FIG. 7b is a cross section diagram of the NMOS transistor of FIG. 7a; and

DETAILED DESCRIPTION OF THE PREFERRED EMBODIMENT

The present invention may utilize metal oxide semiconductor ("MOS") field effect transistor ("FET") technology by connecting positive-channel ("PMOS") and negative-channel ("NMOS") FETs in a complementary metal oxide ("CMOS") configuration. The present invention is adapted for connection to superconductor devices such as, for example, Josephson Junction ("JJ") digital logic circuits, Flux Flow Transistors ("FFT") or Cryotrons. The present invention may be integrated into a hybrid system of both superconductor and semiconductor components when close coupling of components and small system size are required. Furthermore, the semiconductor transistors of the present invention may be adapted for use in cryogenic temperatures as used with superconducting devices. Series connected capacitors are used to store a bias voltage and reject power supply noise. The bias voltage is established by setting the superconductor logic device to a voltage value between the superconductor device logic 0 and 1 levels. A pass transistor is made to conduct and thereby charges the series connected capacitors to a voltage value approximately halfway between the semiconductor supply voltage and ground. The pass transistor is then cut off and the bias voltage, so established, remains on the capacitors and is used to bias the CMOS amplifier for maximum gain. The pass transistor may be controlled to re-establish the bias voltage as necessary. The preferred embodiment of the present invention utilizes MOS transistors having a Beta ratio of approximately unity and operating at temperatures consistent with the temperatures required for superconducting devices.

Figure 1:
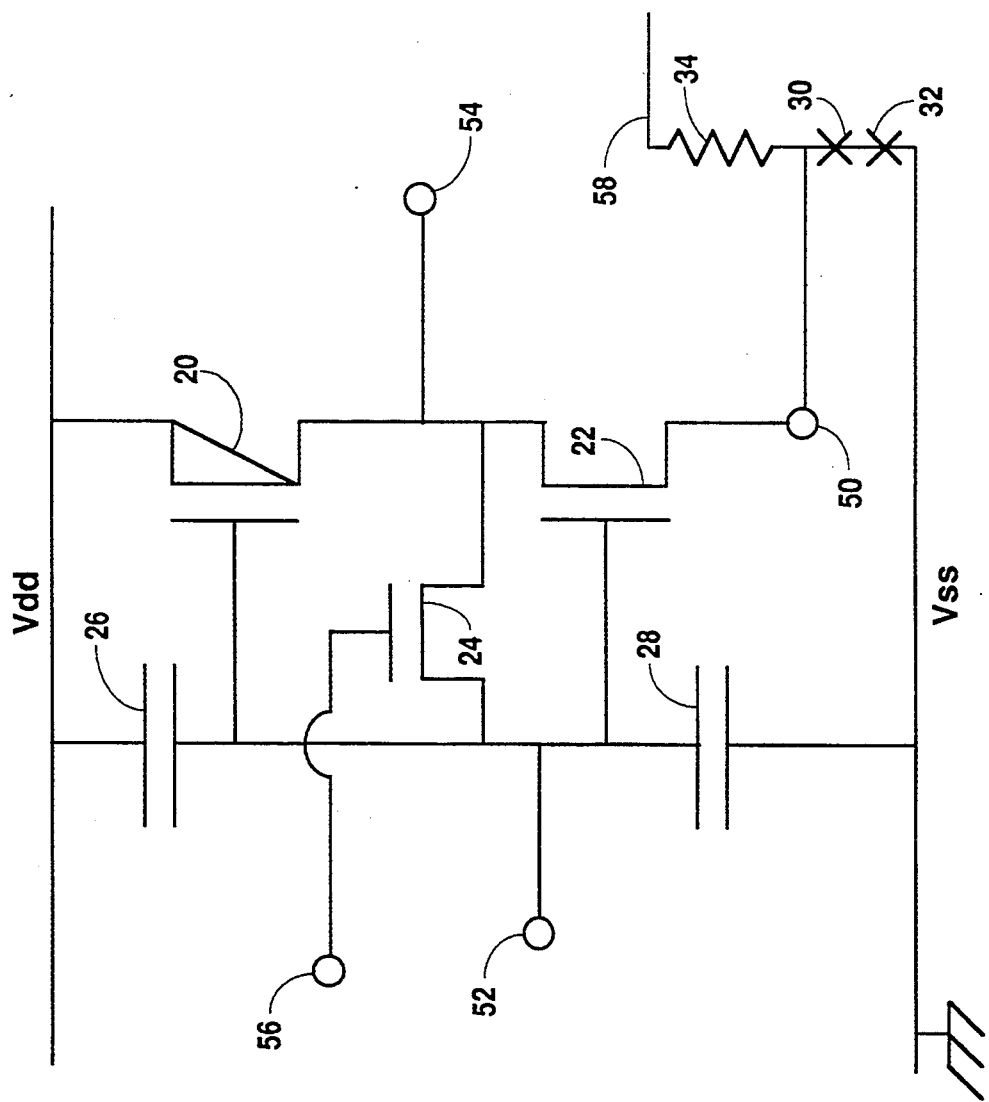
FIG. 1 is a schematic circuit diagram of the first stage of the continuous superconductor to semiconductor converter of the present invention.

Referring now to the drawings, a simplified schematic diagram of a first stage of the continuous converter circuit of the present invention is illustrated in FIG. 1. An NMOS FET 22 and PMOS FET 20 comprise a common gate CMOS amplifier circuit. The gates of FETs 20 and 22 are connected to node 52. The node 52 is at alternating current ("AC") ground through capacitors 26 and 28. The source of FET 22 is connected to input node 50 which is adapted for connection to a JJ superconductor circuit comprised of JJs 30 and 32 and resistor 34.

The input control signal to FET 22 (the voltage at node 52 minus the voltage at node 50, using $V_{ss}$/ground as reference) is amplified by FET 22. The amplified output signal from FET 22 is available at output node 54. FET 20 is not used to amplify any signals but instead acts as a non-linear load for FET 22. FET 20 functions as a current source so long as the voltage at node 54 is not much higher than the voltage at node 52.

Figure 1A:
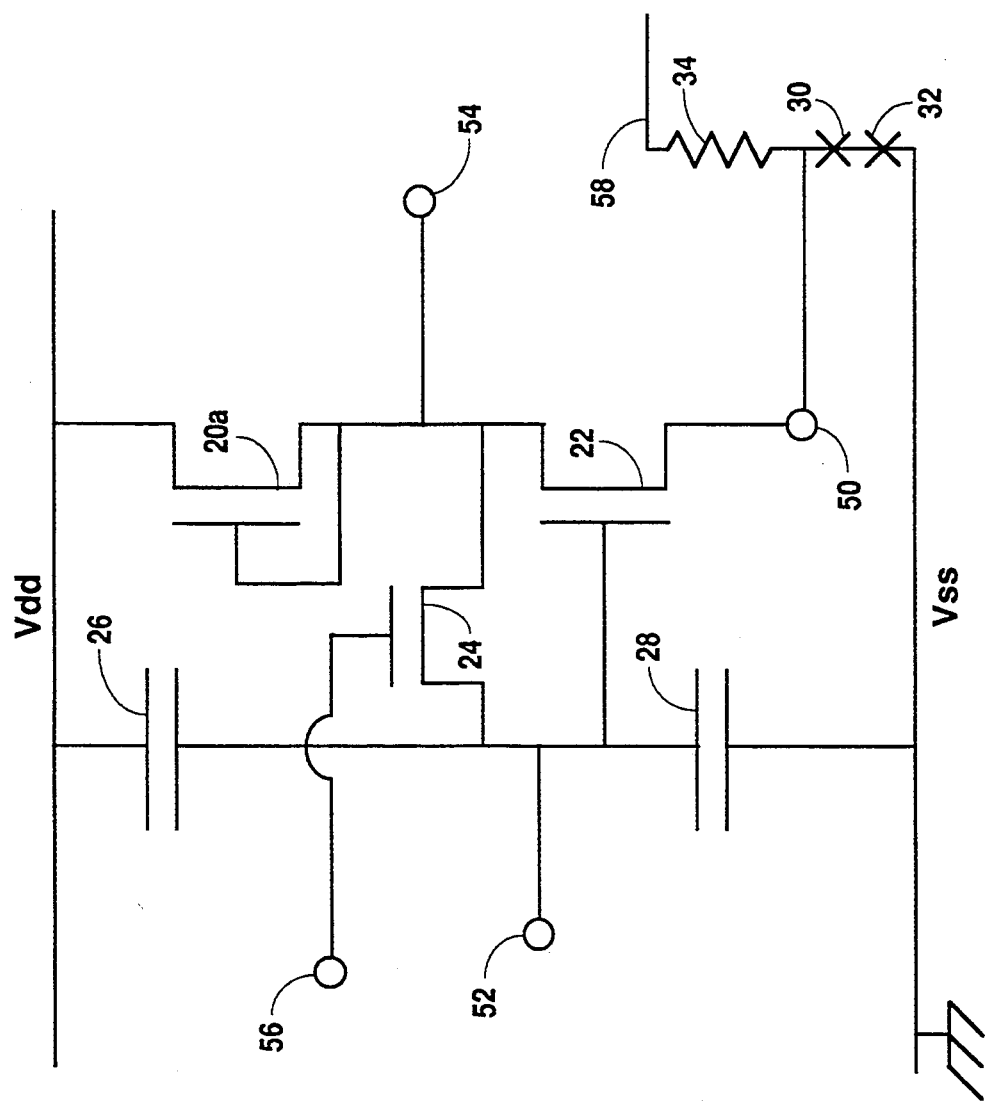
FIG. 1a is a schematic circuit diagram of an alternate embodiment of the circuit of FIG. 1.

An alternate embodiment utilizing only NMOS technology uses an N-depletion mode transistor in place of FET 20 as more fully illustrated in FIG. 1a. An N-depletion mode FET 20a is connected between $V_{dd}$ and the drain of FET 22. FET 20a functions as a constant current source. See Dr. W. Carr et al., *MOS/LSI Design and Application*, McGraw-Hill 1972, p. 74, FIG. 2.9 and accompanying text.

Referring again to FIG. 1, FET 24 is used to establish a bias voltage ("$V_b$") between node 52 and $V_{ss}$/ground. The bias voltage, $V_b$, initially is established to maximize the gain of FET 22. The present invention establishes the value of the bias voltage, $V_b$, by turning on FET 24 with an initialization control voltage at input node 56. With FET 24 "on" the output voltage on node 54 and the bias voltage on node 52 are substantially the same. FET 24 may be controlled to re-establish the bias voltage value when needed.

JJs 30 and 32 may be biased in either a zero-voltage state, a voltage state or any combination thereof. The voltage state ("$V_g$") for a single JJ is approximately 2.6 millivolts for a Niobium junction at 4 Kelvin Units. Control voltage levels on node 58, in conjunction with resistor 34, may be adapted to produce signal voltages at node 50 of zero $V_g$ or $2*V_g$. The system of the present invention turns on FET 24, initially, with a first initialization control voltage on node 56; and to achieve a voltage of $V_g$ on node 50, either JJ 30 or JJ 32 is switched to a voltage state, the other JJ remaining in a zero voltage state, by a second initialization control voltage on node 58. With a control voltage of $V_g$ on node 50, FET 22 and non-linear load FET 20 produce a voltage on node 54 of approximately $(V_{dd}-V_{ss})/2$, i.e. halfway therebetween.

So long as FET 24 is turned on, the voltage at node 52 is substantially the same as the voltage at node 54. When the initialization control voltage is removed from node 56, FET 24 turns off, effectively isolating the voltage charge on node 52. This voltage charge is stored in capacitors 28 and 26 and thereafter used as the bias voltage, $V_b$. $V_b$ remains substantially the same value indefinitely due to greatly reduced leakage current of semiconductor devices at cryogenic temperatures.

Although it is possible to design a single stage semiconductor amplifier to convert JJ signals, typically 5 millivolts, to the 1-2 volt signals required for CMOS semiconductor logic, a limitation exists in semiconductor amplifier design. This limitation restricts the available bandwidth of high gain amplifiers and is referred to in the art of amplifiers as the gain-bandwidth product. A high gain amplifier will have a narrow bandwidth, thus, restricting the maximum operating frequency of the logic system. It is well known in the art that multistage amplifiers can improve upon the gain-bandwidth product restrictions of a single stage amplifier, provided the increased delay of the signal through the added amplifier stage(s) is tolerable. In addition, a high enough gain single stage amplifier would have to be designed using long channel transistors which adds capacitance to the circuit and therefore adds delay to the signals. For the above reasons, a second stage of semiconductor amplification is added to the circuit of the present invention.

Figure 2:
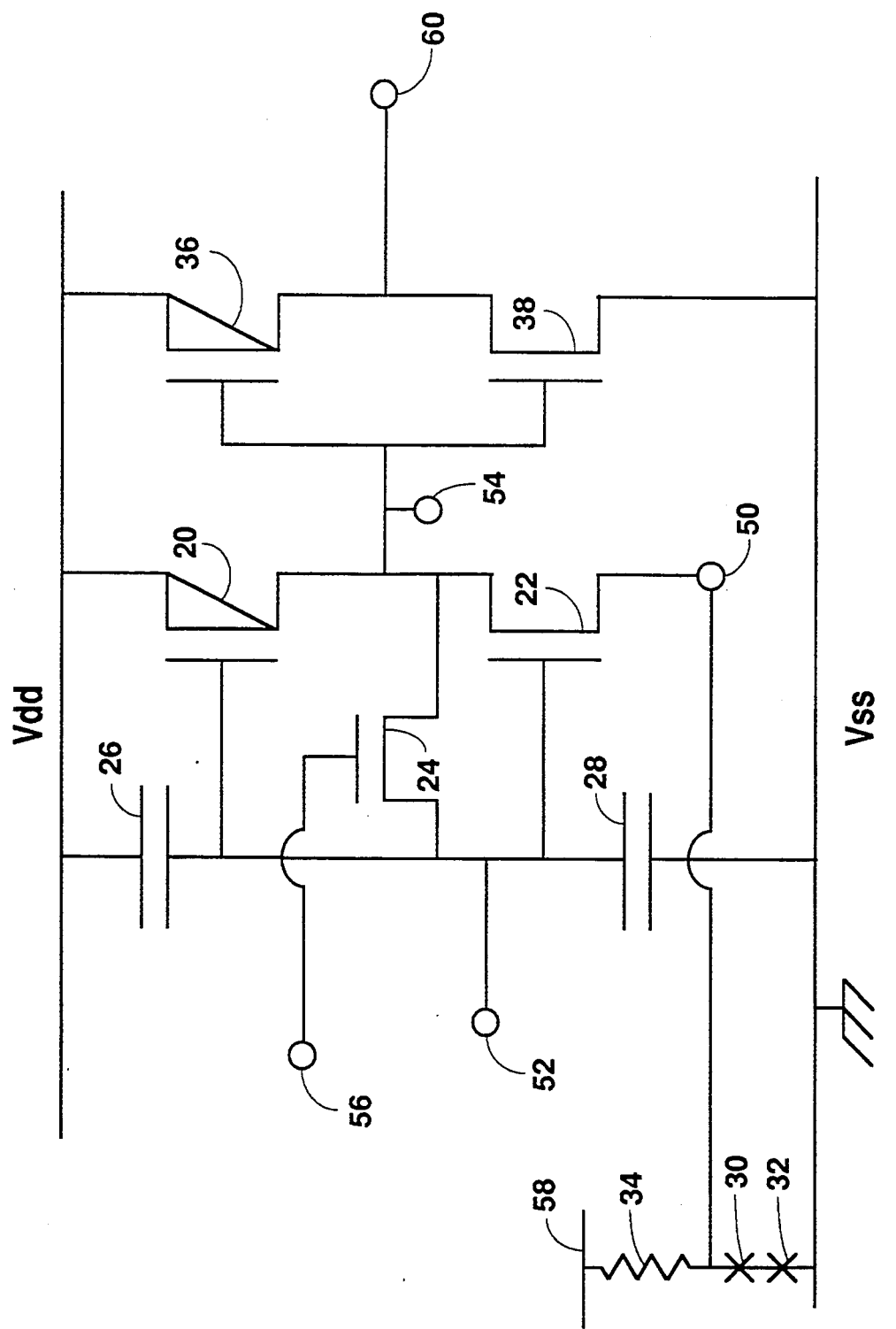
FIG. 2 is a schematic circuit diagram of the present invention illustrating first and second CMOS amplifiers.

Referring now to FIG. 2, the preferred embodiment of the present invention is illustrated as a schematic circuit diagram. PMOS FET 36 and NMOS FET 38 comprise an inverting CMOS amplifier having an output connected to output node 60 and an input connected to node 54. The approximately 100 millivolt signal at node 54 is amplified to a signal voltage having high and low voltage limits of $V_{dd}$ and $V_{ss}$/ground, respectively. The present invention utilizes minimum sized transistors in the semiconductor amplifiers, thus, capacitive loading is minimized and faster rise time signals may be amplified without degradation.

Figure 3:
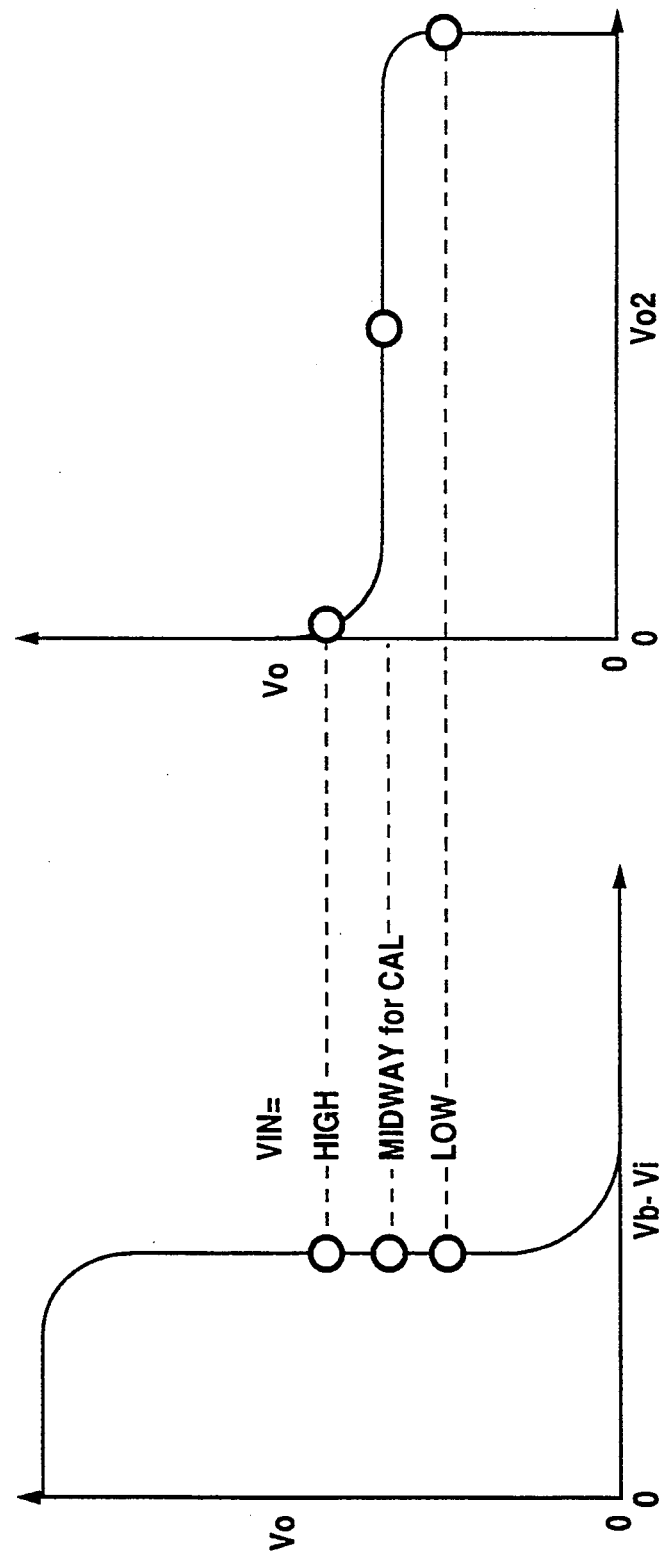
FIG. 3 is a schematic diagram illustrating the transfer curves of the circuit of FIG. 2.

The initialization (calibration) procedure for the two stage converter illustrated in FIG. 2 is graphically represented in FIG. 3. Referring to FIG. 3, $V_b-V_i$ is the voltage difference between nodes 50 and 52 and is the signal input control voltage for the first CMOS amplifier consisting of FETs 20 and 22. $V_o$ is the output signal voltage at node 54 and $V_{o2}$ is the output signal voltage at node 60. To initialize (calibrate) the preferred embodiment of the present invention, FET 24 is turned on, which because the signal voltage, $V_g$, at node 50 ($V_i$) is very small it forces the voltage at node 52 ($V_b$) to equal the voltage at node 54 ($V_o$) because of the conductive path through FET 24. Also the voltage at node 60 ($V_{o2}$) is approximately the same value as the voltage at node 54 ($V_o$).

This initialization creates a bias voltage that is retained on capacitors 26 and 28 when FET 24 is turned off. The bias voltage established during the calibration procedure above produces a logic signal voltage at node 60 halfway between a logic 1 and a logic 0 ($V_{dd}$ and $V_{ss}$/ground, respectively). Henceforth, after FET 24 is turned off, the bias voltage remains on node 52 and establishes the maximum gain for the CMOS converter circuit illustrated in FIG. 2. With a JJ signal swing of from zero voltage to $2*V_g$ at node 50 ($V_i$ of FIG. 3) the output voltage swing at node 60 ($V_{o2}$ of FIG. 3) will be to the limits of $V_{dd}$ and $V_{ss}$, respectively, precisely the desired signal range for CMOS logic circuits.

Figure 4:
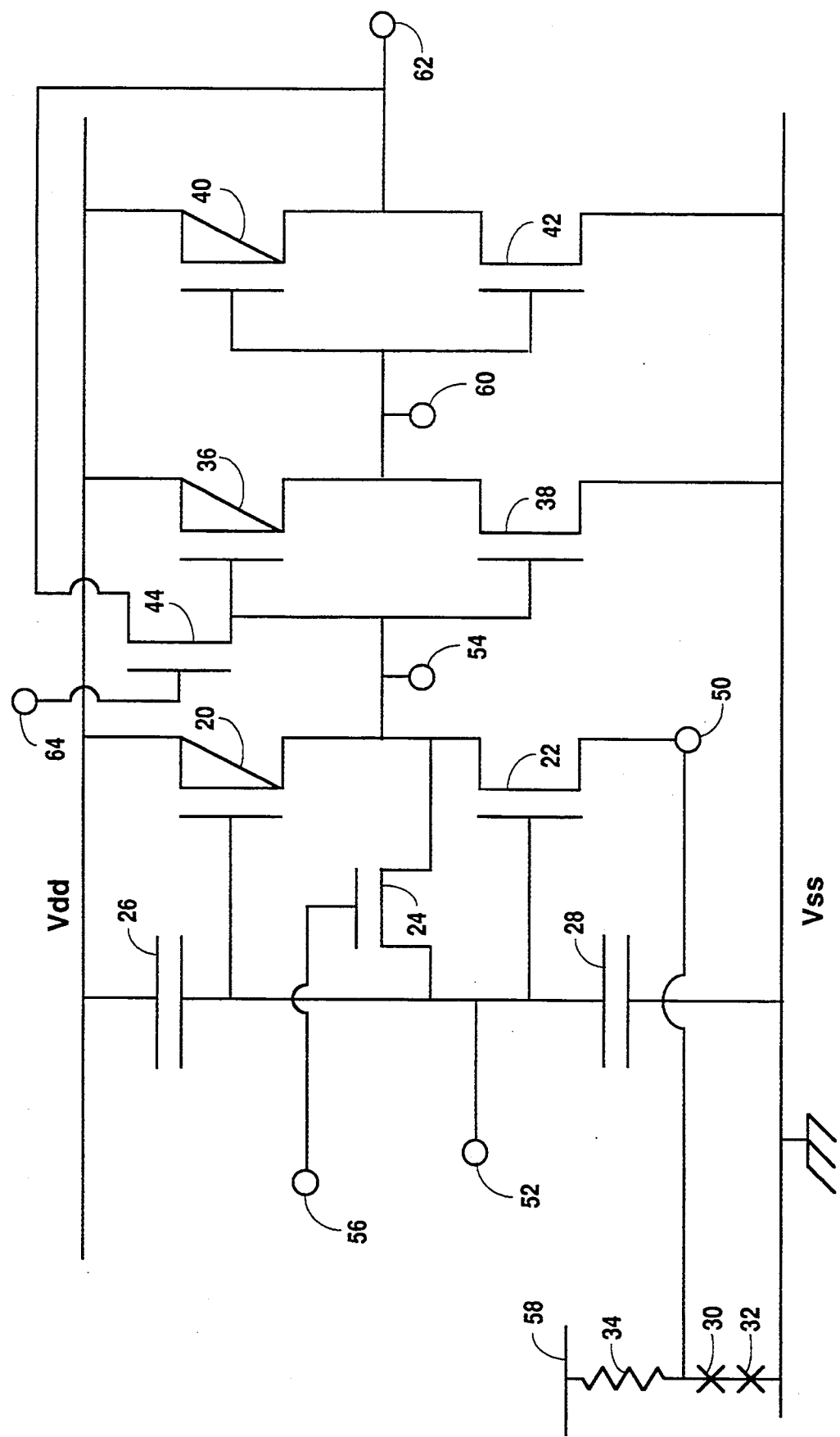
FIG. 4 is a schematic circuit diagram illustrating a three stage continuous superconductor to semiconductor converter circuit.

Referring now to FIG. 4, a schematic circuit diagram of a three stage semiconductor amplifier continuous converter circuit is illustrated. PMOS FET 40 and NMOS FET 42 comprise an inverting CMOS amplifier having an output connected to node 62 and an input connected to node 60. FETs 40 and 42 may have higher transconductance than FETs 36 and 38 in order to drive a larger capacitive load. The gain of this third amplifier stage can make up for any lack of gain in the earlier amplifier stages. The disadvantage, however, of a third amplifier is an extra stage of signal delay.

An NMOS FET 44 may be used as a positive feedback path to latch the two CMOS inverter amplifiers (FETs 36, 38, 40, and 42) in a bistable configuration which can store one bit of information. FET 44 is turned on by an input control signal at node 64. FET 44 may also be used to accelerate conversion if it is turned on shortly after the arrival of data at node 54, however, this may require precise timing of a control signal at node 64.

Figure 5:
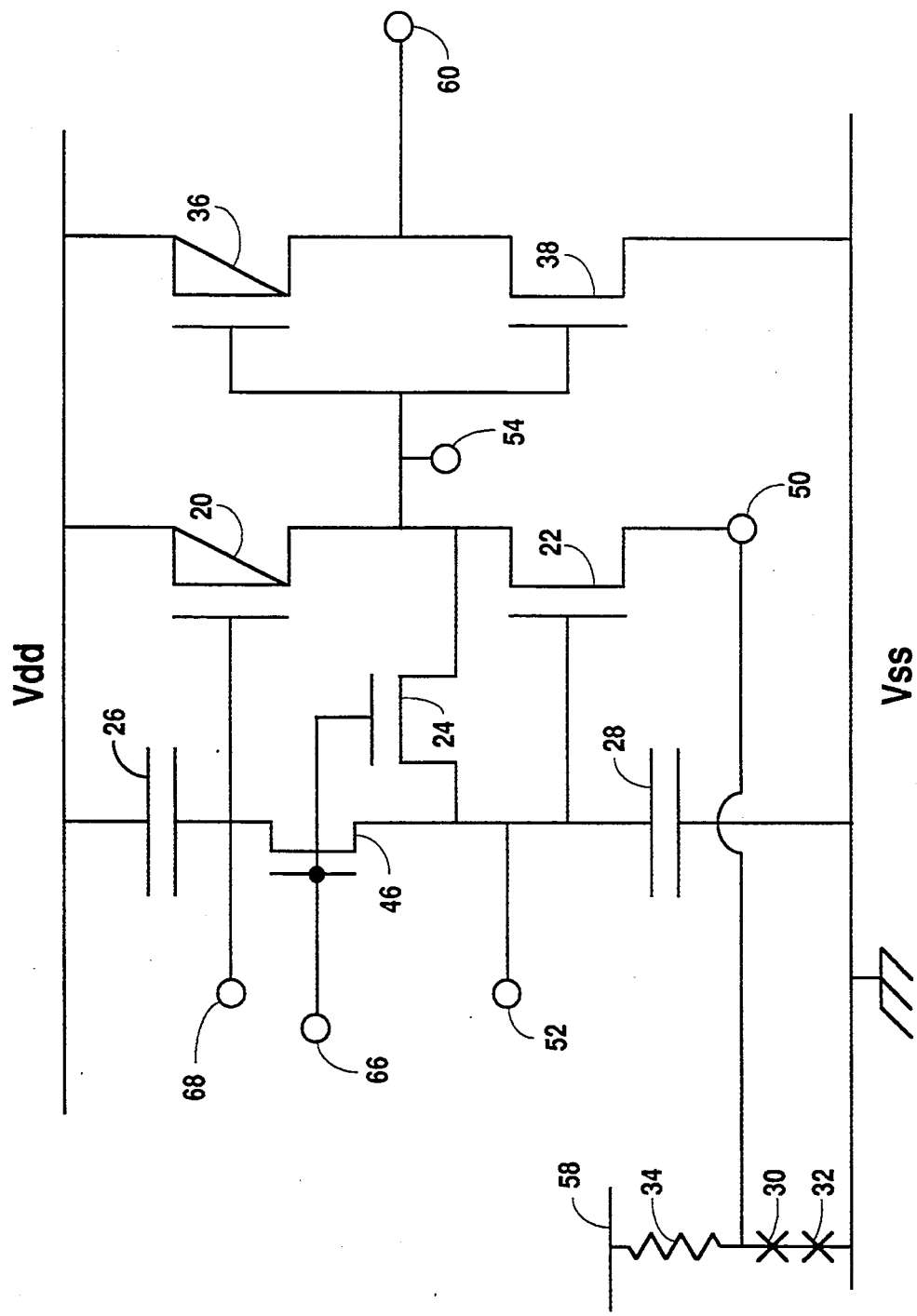
FIG. 5 is a schematic circuit diagram illustrating the present invention with enhanced power supply noise rejection circuitry.
Figure 6A:
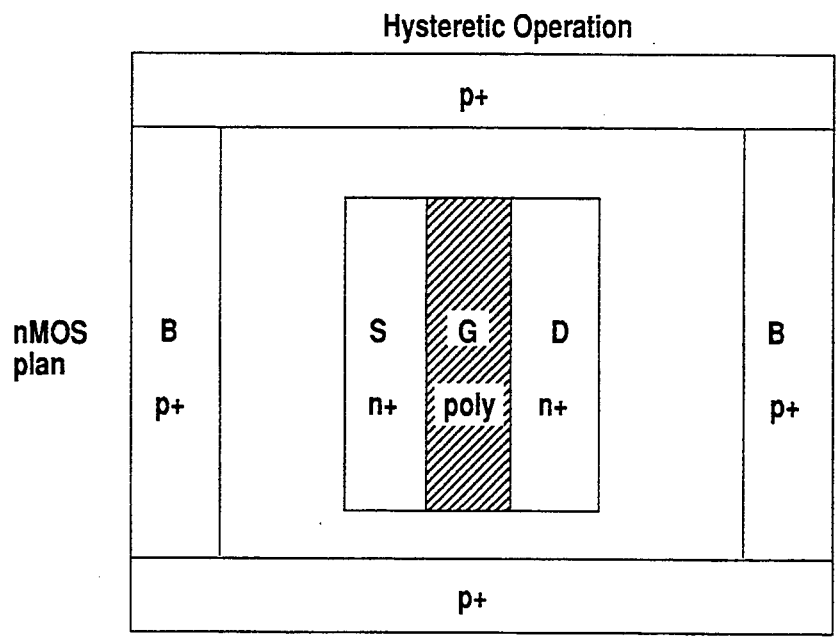
FIG. 6a is a schematic diagram of an NMOS transistor in plan view.
Figure 6B:
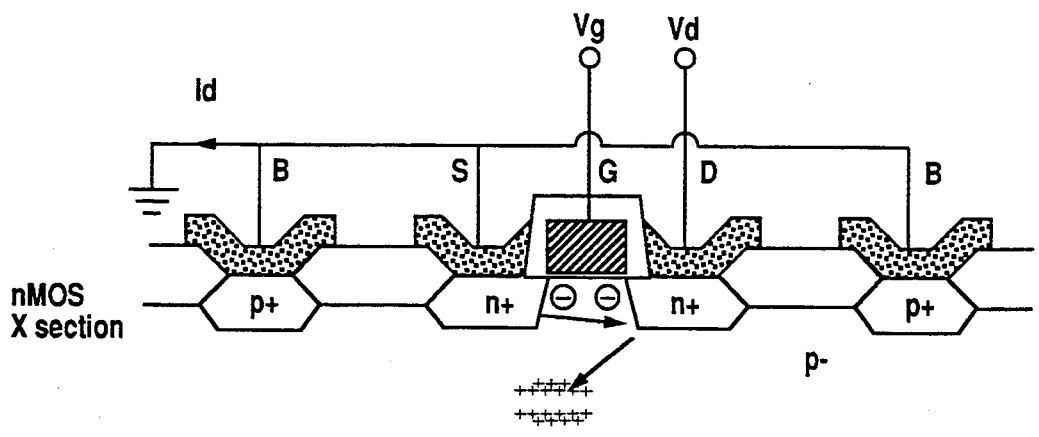
Figure 6C:
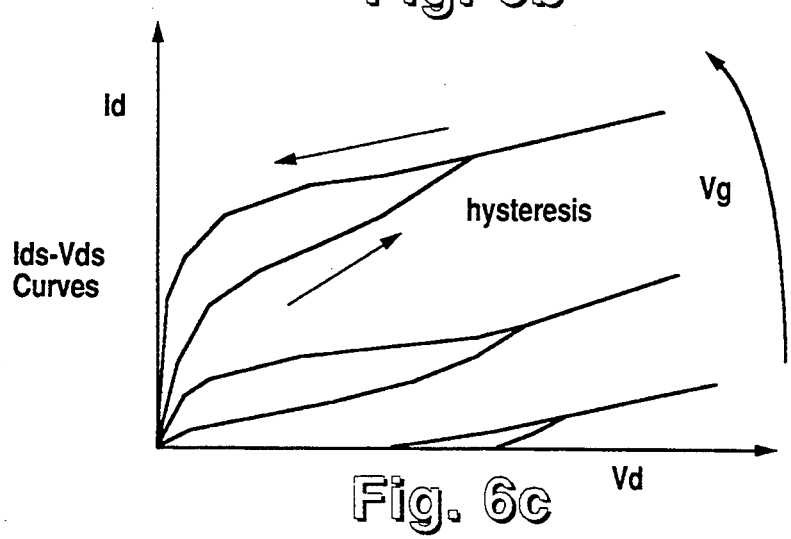
FIG. 6c is typical hysteretic drain current-voltage curves of an NMOS transistor operating at low temperatures.
Figure 7A:
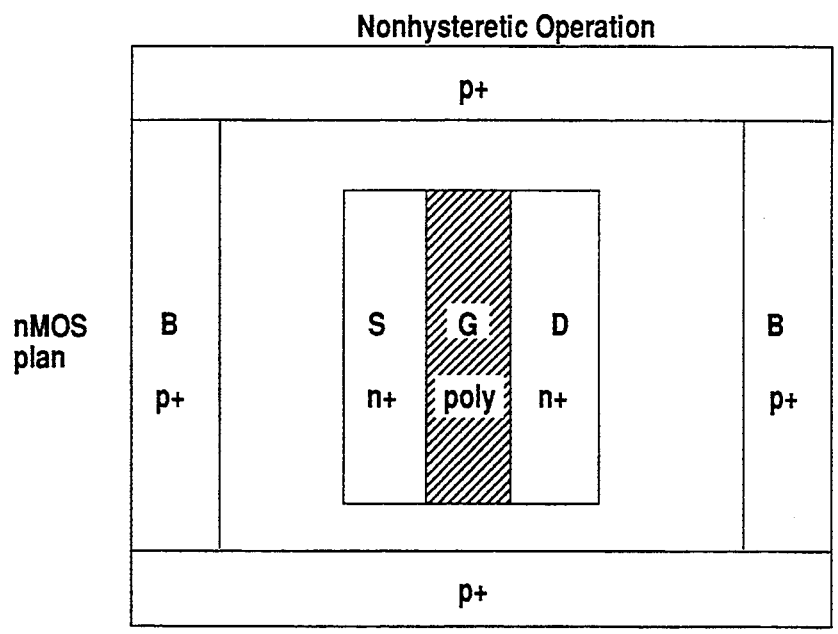
FIG. 7a is a schematic diagram of an NMOS transistor as used in the present invention illustrated in plan view.
Figure 7B:
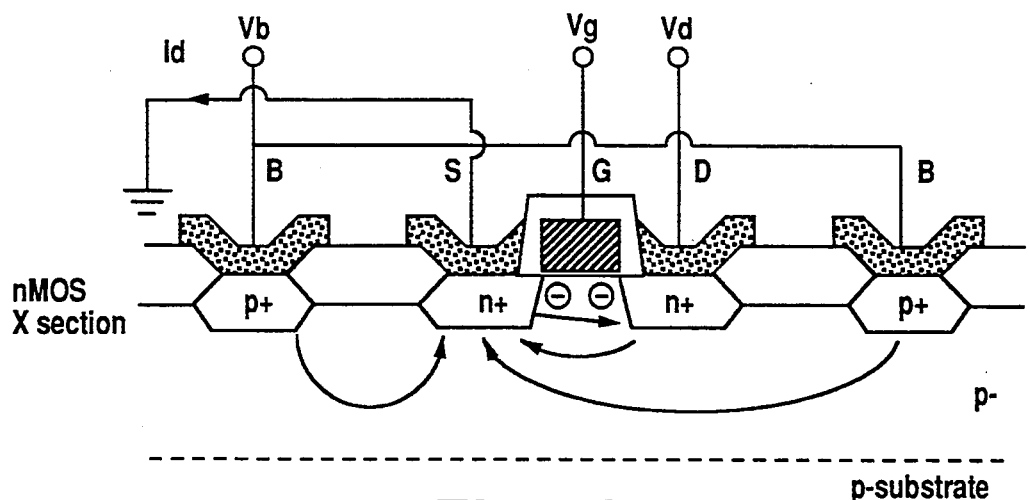
Figure 7C:
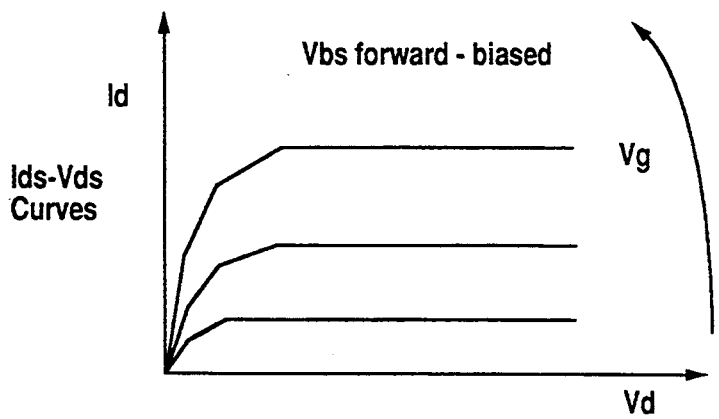
FIG. 7c is the non-hysteretic drain current-voltage curves of an NMOS transistor of the present invention operating at low temperatures.

Referring now to FIG. 5, a schematic circuit diagram of the preferred embodiment of the present invention having a circuit to enhance power supply noise rejection is illustrated. A NMOS FET 46 is placed between capacitors 26 and 28 and controlled by a control signal on node 66. Node 66 connects to the gates of both FETs 24 and 46 and controls both in the same fashion and at the same time. This embodiment of the present invention may be initialized in the same way as described for the circuit of FIG. 2 above. The drain of FET 24 may be connected to either the source or the drain of FET 46 with very little difference in circuit operation.

A control signal on node 66 turns FETs 24 and 46 on, then the initialization (calibration) JJ signal ($V_g$) is placed on node 50 which sets the proper quiescent voltage level at node 54, establishing the correct bias voltage at node 52 for maximum CMOS amplifier gain. After the bias is established the control signal on node 66 turns off FETs 24 and 46, isolating the bias voltage charge on capacitor 28 from the voltage charge on capacitor 26.

This further isolates the bias voltage, $V_b$, at node 52 from the disturbing effects of noise on $V_{dd}$, and isolates the bias voltage, $V_b'$, at node 68 from the disturbing effects of noise on $V_{ss}$. As a result of the isolation provided by FET 46, any noise at node 54 as a result of noise on either $V_{dd}$ or $V_{ss}$ depends mostly on reducing the output conductance of FETs 20 or 22 when in saturation, respectively. The output conductance can be made very small by using the hysteresis suppression method discussed previously herein.

As improved CMOS fabrication processes become available the same circuit and function of the present invention can be fabricated in smaller area. Smaller area means less circuit capacitance which allows greater signal frequency bandwidth resulting in the ability to handle higher speed digital signals. A well known and frequently cited CMOS scaling parameter is lambda. Typically lambda is a length equal to ½ the minimum as-drawn gate length of the MOSFETs.

In a scale-able design, every component (transistor, capacitor, resistor) has an as-drawn width and length which are some integer multiple of the scaling parameter. The ratio of width to length, W/L, controls the transconductance of the MOSFETs in direct proportion, where the proportionality constant is called Beta, as mentioned above. The product of width and length controls the capacitance of a transistor measured between the gate terminal and the source terminal (with the other terminals open). A given fabrication process is minimally characterized by minimum widths and lengths of each component (set by process yield considerations), a transconductance for unity W/L, and a transistor capacitance per unit area.

A scale-able specification for the preferred embodiment of the present invention may be for example:

|  | W | L | (in units of lambda) |
| --- | --- | --- | --- |
| FET 20 | 3 | 3 | |
| FET 22 | 3 | 3 | |
| FET 24 | 2 | 4 | |
| FET 36 | 4 | 2 | |
| FET 38 | 4 | 2 | |
| FET 40 | 4 | 2 | |
| FET 42 | 4 | 2 | |
| FET 44 | 2 | 4 | |
| FET 46 | 2 | 4 | |
| Capacitor 26 | 10 | 10 | |
| Capacitor 28 | 10 | 10 | |

Semiconductor manufacturers currently offer semiconductor fabrication using a lambda in the range of 0.3 to 1.2 micrometers. Referring again to FIG. 5, may it be noted that FETs 20 and 22 are not designed with a minimum length of 2 lambda because in most CMOS processes the drain output conductance increases for minimum length transistors, and this degrades the stage gain. On the other hand, the length of FETs 20 and 22 should not be overly long because this increases the capacitance of the FETs, thereby decreasing their transconductance and lowering their useful signal bandwidth.

Using a 2.5 volt power supply ($V_{dd}$-$V_{ss}$) the quiescent current through the first amplifier stage, from $V_{dd}$ through node 50 to $V_{ss}$ may be, for example, about 8 microamperes (power dissipation of 20 microwatts). With FET 24 turned off, the first stage FETs 20 and 22 should drive the second stage FETs 36 and 38 with enough signal so that either FET 36 or FET 38 is off (not conducting), therefore the quiescent current through the second stage FETs 36 and 38 is zero except for picoampere leakage. However, when the input signal data changes the second stage must charge or discharge the capacitance of node 60. The non-quiescent power dissipation of the second stage is a function of the data rate, being nearly zero at dc and rising to $CV^2f$, where C is the capacitance of node 60 (plus the input capacitance of any other circuits connected to node 60), V is the signal voltage swing on node 60, and f is the frequency of the data rate.

The layout of the preferred embodiment of the present invention minimizes the area of nodes 54 and 60 while providing guard rings around each transistor. These guard rings are used in cryo-CMOS to stabilize the well potential under the transistors during carrier-freeze-out conditions at cryo-temperatures. The minimum area minimizes capacitance and thereby maximizes bandwidth.

Superconducting field effect transistors ("SFET") may be used in place of the MOS transistors discussed above, provided the SFETs have low drain-source conductance $g_{ds}$ in the saturation region for good amplifier gain. However, to obtain low $g_{ds}$ for drain-source voltage up to the supply voltage, very low supply voltages and threshold voltages may be necessary. Therefore, use of SFETs may further reduce the already low power consumption of the embodiment of the present invention and improve the density of a JJ continuous converter on an integrated circuit.

The present invention, therefore, is well adapted to carry out the objects and attain the ends and advantages mentioned as well as others inherent therein. While presently preferred embodiments of the invention have been given for the purpose of disclosure, numerous changes in the details of construction and steps of the process will be readily apparent to those skilled in the art and are encompassed within the spirit of the invention and the scope of the appended claims.

What is claimed is:

1. An electrical circuit for continuously converting superconductor signal levels to semiconductor transistor signal levels, said circuit comprising:
   a capacitive bias means connected to a power supply having first and second voltage terminals, said first voltage terminal having a different voltage potential than said second voltage terminal;
   a first amplifier having an input and output;
   said first amplifier connected to said first and second voltage terminals;
   said first amplifier input connected to a superconductor signal;
   said first amplifier connected to said capacitive bias means for biasing at maximum gain; and
   a first switch connected between said first amplifier output and said capacitive bias means, wherein said first switch connects said capacitive bias means to said first amplifier output when a superconductor calibration signal is used to initialize a bias voltage value that maximizes the gain of said first amplifier.

2. The circuit of claim 1, further comprising:
   a second amplifier having an input and output;
   said second amplifier input connected to said first amplifier output;
   said second amplifier connected to said first and second voltage terminals.

3. The circuit of claim 2, further comprising:
   a third amplifier having an input and output;
   said third amplifier input connected to said second amplifier output;
   said third amplifier connected to said first and second voltage terminals.

4. The circuit of claim 2, wherein said capacitive bias means comprises:
   first and second capacitors, said first and second capacitors connected in series and connected to said first and second voltage terminals; and
   said first switch connected between the junction of said series connected first and second capacitors and said first amplifier output.

5. The circuit of claim 4, further comprising:
   a second switch connected between said first and second capacitors; and
   said second switch connected to and controlled by said superconductor calibration signal.

6. The circuit of claim 3, further comprising:
   a second switch connected between said third amplifier output and said first amplifier output; and
   said second switch connected to and controlled by a latching control signal.

7. An electrical circuit for continuously converting superconductor signal levels to semiconductor transistor signal levels, said circuit comprising:
   first and second capacitors, said first and second capacitors connected in series and connected to a power supply having first and second voltage terminals, said first voltage terminal having a different voltage potential than said second voltage terminal;
   first, second and third transistors, each having a source, gate and drain;
   said first transistor source connected to said first voltage terminal;
   said first transistor drain, said second transistor drain and said third transistor drain connected together to form a first output node, wherein said first output node generates semiconductor transistor signal levels;
   said first transistor gate, said second transistor gate, and said third transistor source connected to the junction of said series connected first and second capacitors;
   said third transistor gate connected to a bias initialization control signal; and
   said second transistor source connected to a superconductor signal.

8. The circuit of claim 7, wherein said first transistor gate is connected to said first output node.

9. The circuit of claim 7, further comprising:
   fourth and fifth transistors, each having a source, gate and drain;
   said fourth transistor source connected to said first voltage terminal;
   said fourth and fifth transistor gates connected to said first output node;

said fifth transistor source connected to said second voltage terminal; and said fourth transistor drain and said fifth transistor drain connected together to form a second output node, wherein said second output node generates semiconductor transistor signal levels.

10. The circuit of claim 9, further comprising:

sixth and seventh transistors, each having a source, gate and drain;

said sixth transistor source connected to said first voltage terminal;

said sixth and said seventh transistor gates connected to said second output node;

said seventh transistor source connected to said second voltage terminal; and said sixth transistor drain and said seventh transistor drain connected together to form a third output node, wherein said third output node generates semiconductor transistor signal levels.

11. The circuit of claim 10, further comprising:

an eighth transistor having a source, gate and drain;

said eighth transistor source connected to said third output node;

said eighth transistor drain connected to said first output node; and said eighth transistor gate connected to a latching control signal.

12. The circuit of claim 7, further comprising:

a fourth transistor having a source, gate and drain;

said fourth transistor source and drain connected therebetween said series connected first and second capacitors; and said fourth transistor gate connected to said third transistor gate and connected to said bias initialization control signal.

13. The circuit of claim 7, wherein said transistors are semiconductor field effect transistors.

14. The circuit of claim 7, wherein said transistors have Beta ratios near unity.

15. The circuit of claim 7, wherein said transistors are complementary metal oxide semiconductor field effect transistors.

16. The circuit of claim 7, wherein said transistors are negative channel metal oxide semiconductor field effect transistors.

17. The circuit of claim 8 wherein said transistors are negative channel metal oxide semiconductor field effect transistors and said first transistor is a depletion mode transistor.

* * * * *